United States Patent [19]

Renoult

[11] Patent Number: 4,609,885
[45] Date of Patent: Sep. 2, 1986

[54] DEVICE PROVIDING COMPENSATION FOR ACCELERATION SENSITIVITY OF AN OSCILLATOR

[75] Inventor: Patrick Renoult, Paris, France

[73] Assignee: Compagnie d'Electronique et de Piezo-Electricite C.E.P.E., Argenteuil, France

[21] Appl. No.: 670,578

[22] Filed: Nov. 13, 1984

[30] Foreign Application Priority Data

Nov. 15, 1983 [FR] France ................ 83 18130

[51] Int. Cl.$^4$ ............................................. H03B 5/04
[52] U.S. Cl. ..................................... 331/158; 331/65; 331/116 R; 73/517 A
[58] Field of Search ........ 331/41, 65, 116 R, 116 FE, 331/158, 175; 73/505, 511, 517 A; 340/669

[56] References Cited

U.S. PATENT DOCUMENTS 3,201,984  8/1965  Hinnah et al. ................ 73/862.59
4,096,445  6/1978  Hopwood et al. ......... 331/116 R X
4,318,063  3/1982  Przyjemski ..................... 331/158
4,453,141  6/1984  Rosati ............................. 331/158

FOREIGN PATENT DOCUMENTS 0017554  10/1980  European Pat. Off. .

OTHER PUBLICATIONS

Joseph M. Przyjemski, Proceedings of the 32nd Annual Symposium on Frequency Control, 1978, Atlantic City, NJ, pp. 426–431.

Primary Examiner—Eugene R. Laroche
Assistant Examiner—Robert J. Pascal
Attorney, Agent, or Firm—Oblon, Fisher, Spivak, McClelland & Maier

[57] ABSTRACT

A device having the function of compensating for the acceleration sensitivity of an oscillator of given nominal frequency comprises an acceleration-sensing element such as a filter which is capable of producing a signal having a nominal frequency equal to that of the oscillator to be compensated but, in respect of its nominal frequency, has higher sensitivity to acceleration than the oscillator to be compensated. The phase difference between the frequency of the oscillator and the frequency produced by the filter is compared in a mixer in order to extract the phase modulation induced by the acceleration. A follow-up control amplifier receives the output signal of the phase comparator and produces at its output a signal for correcting the oscillator.

10 Claims, 6 Drawing Figures

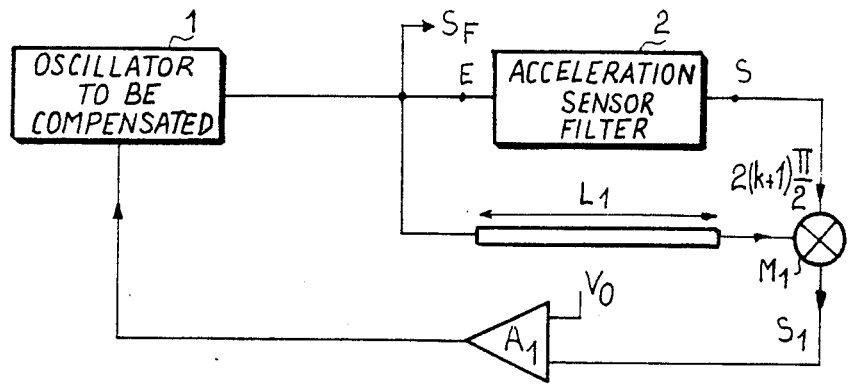
FIG_1
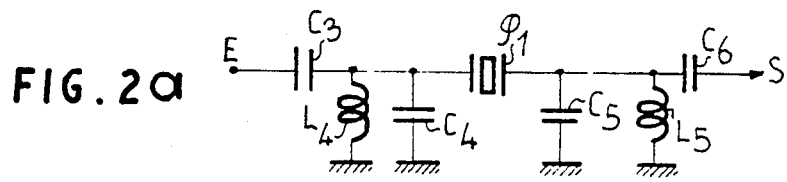
FIG.2a
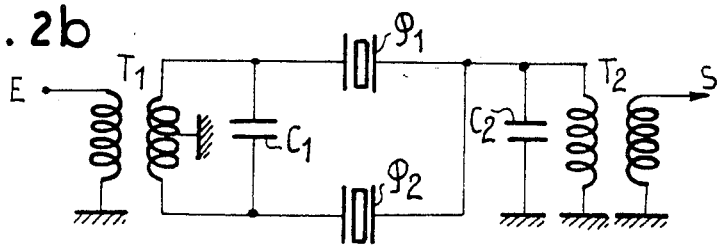
FIG.2b
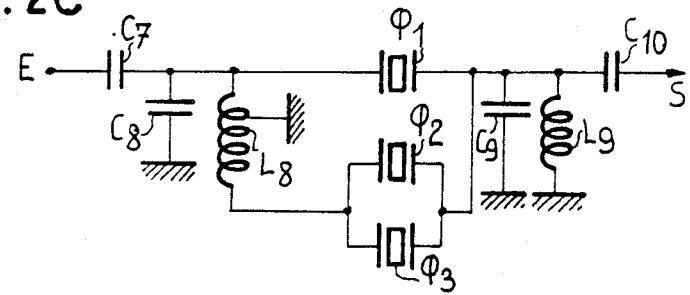
FIG.2c

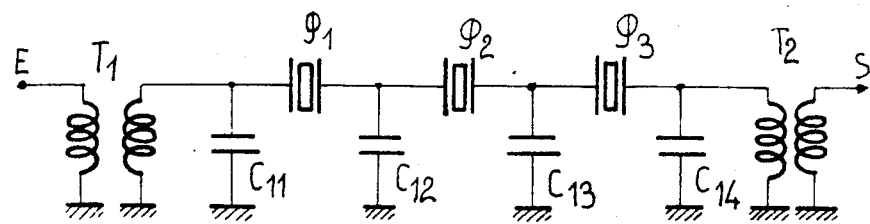
FIG_2-d
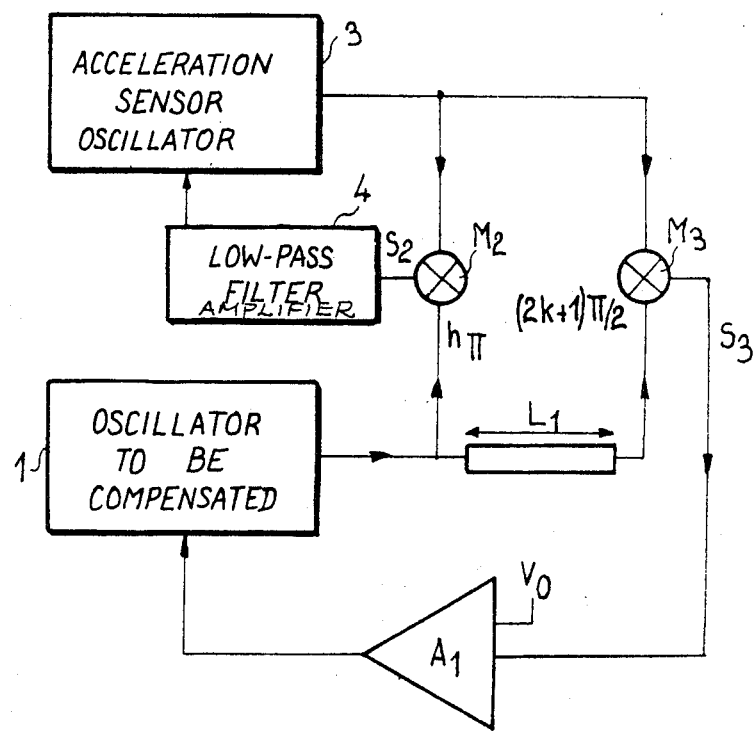
FIG_3

DEVICE PROVIDING COMPENSATION FOR ACCELERATION SENSITIVITY OF AN OSCILLATOR

BACKGROUND OF THE INVENTION

1. Field of the Invention

The present invention relates to a device providing compensation for acceleration sensitivity of an oscillator.

2. Description of the Prior Art

Piezoelectric crystal oscillators exhibit sensitivity to accelerations and this results in phase modulation of the output signal of the oscillator. It appears desirable in some applications to compensate for this shortcoming, thus entailing the need to associate the oscillator with a device for measuring acceleration. In practice, however, the operation of an accelerometer of the piezoelectric type calls for the use of an amplifier having a very high input impedance in order to pick up the low frequencies. An amplifier of this type produces background noise and parasitic disturbances which in turn produce an effect of degradation of the spectrum of the oscillator which is thus compensated.

The present invention is directed to a device which provides compensation for the acceleration sensitivity of an oscillator and is capable of producing action without impairing the spectrum of the oscillator.

SUMMARY OF THE INVENTION

The invention thus has for its object a device having the function of compensating for the acceleration sensitivity of an oscillator of nominal frequency, said device being distinguished by the fact that it comprises:

a sensing element which is capable of producing a signal of nominal frequency equal to that of the oscillator but which, in respect of its nominal frequency, is more sensitive to acceleration than said oscillator by a factor at least equal to 2;

a comparator for comparing the phase difference existing between the frequency of the oscillator and the frequency produced by said element in order to extract the phase modulation induced by the acceleration;

and a follow-up control device for receiving the output signal from the phase comparator and producing at its output an oscillator correction signal.

The correction signal can be applied in such a manner as to modify the phase of the negative-feedback loop of the oscillator.

In one embodiment, the comparator is a mixer which receives the output signal of the sensing element and the output signal of the oscillator to be compensated which is phase-shifted $(2k+1)(\pi/2)$ when no acceleration occurs, where k is a whole number or zero. Said phase shift $(2k+1)(\pi/2)$ can be obtained by means of a length of line placed between the output of the oscillator to be compensated and the corresponding input of the mixer.

In a first alternative embodiment, said sensing element is a filter, the input of which is supplied from the output of the oscillator to be compensated.

In a second alternative embodiment, said sensing element is a second oscillator. The device can in this case comprise a device for correcting the frequency drift of the second oscillator with respect to the oscillator to be compensated. By way of example, this correcting device comprises a second mixer which receives the outputs of each oscillator having a phase shift of $2h \times \pi$, where h is a whole number or zero and the amplified output of which constitutes a signal for correcting the drift of the second oscillator. The drift-correcting signal can accordingly be applied so as to modify the phase of the negative-feedback loop of the second oscillator.

BRIEF DESCRIPTION OF THE DRAWINGS

Other features of the invention will be more apparent upon consideration of the following description and accompanying drawings, wherein:

FIG. 1 illustrates a compensating device for the practical application of a sensing filter in accordance with a first embodiment of the invention;

FIGS. 2a to 2d illustrate different alternative forms of construction of sensing filters;

FIG. 3 illustrates a compensating device in accordance with a second alternative embodiment of the invention for the practical application of a second oscillator which performs the function of an acceleration sensor.

DESCRIPTION OF THE PREFERRED EMBODIMENTS

In FIG. 1, the output signal $S_F$ having the same nominal frequency as that of the oscillator 1 and delivered by an oscillator 1 to be compensated is applied to the input of a filter 2 which exhibits high acceleration sensitivity, this sensitivity being higher by at least a factor of 2 than the acceleration sensitivity of the oscillator 1 to be compensated. The oscillator 1 and the filter 2 are so arranged as to be subjected to the same accelerations. In the case of a quartz crystal, for example, ratios of the order of 2 to 3 exist between the cut which has the highest sensitivity to acceleration (AT-cut) and is suitable for the filter and the cuts which have the lowest sensitivity to acceleration and are suited to the fabrication of the crystal of the oscillator to be compensated.

Furthermore, lithium tantalate has a distinctly higher sensitivity to acceleration than quartz (by a factor of approximately 10). This material is therefore particularly well-suited to the fabrication of the filter.

When accelerations occur, there is collected at the output of the filter 2 an output signal S which is phase-modulated with respect to the signal which was applied to its input. This phase modulation is detected by a mixer $M_1$ which receives at its inputs respectively the input of the filter 2 (that is, the output of the oscillator 1) and the output of the filter 2. More particularly, detection of the phase modulation is obtained by constructing the device in such a manner as to ensure that, when no acceleration is present, the signals applied to the two inputs of the mixer $M_1$ are phase-shifted by $(2k+1)(\pi/2)$, where k is a whole number or zero. This phase shift can be obtained by means of a line having a suitable length L and interposed between the output of the oscillator 1 and the corresponding input of the mixer $M_1$.

The output signal $S_1$ of the mixer $M_1$ is applied to one input of an operational amplifier $A_1$. The amplifier $A_1$ receives at its other input a reference voltage $V_O$ which has the value of the signal $S_1$ when the filter is not subjected to any acceleration. In principle, the mixer $M_1$ in fact delivers a signal equal to one-half its maximum nominal value when the two signals which are present at its inputs are displaced in phase by exactly $(2k+1)(\pi/2)$. When accelerations occur, the signal $S_1$ varies about this value.

The output signal of the operational amplifier $A_1$ is fed to the oscillator to be compensated and is applied to this latter in such a manner as to modify the phase of the negative feedback loop of the oscillator. This correction can be carried out in the conventional manner by control of a varactor diode connected in series or in parallel in the negative-feedback loop of the oscillator and has the effect of producing a slight variation in the nominal frequency of this latter, thus compensating for the effects of accelerations. In fact, the phase modulation produced by accelerations is equivalent in a first approximation to a modification of the oscillator frequency.

As shown in FIG. 2a, the filter 2 comprises a quartz crystal $Q_1$. More precisely, the filter comprises an impedance-matching capacitor $C_3$ connected in series from the filter input E and an impedance-matching capacitor $C_6$ connected in series from the filter output S. The quartz crystal $Q_1$ which is connected in series between the capacitors $C_3$ and $C_6$ is provided at its terminals with frequency-matching networks tuned to the frequency of the quartz crystal $Q_1$. These networks are constituted by inductance-capacitance pairs mounted in parallel between the ends of the quartz crystal $Q_1$ and ground, as designated respectively by the references $L_4$ and $C_4$ on the side nearest the input E and by the references $C_5$ and $L_5$ on the side nearest the output S. These input networks make it possible to increase the selectivity of the filter.

In the alternative embodiment of FIG. 2b, the filter 2 comprises two quartz crystals $Q_1$ and $Q_2$ having the same nominal frequency as the oscillator 1 but oriented in space in such a manner as to be sensitive to acceleration in different directions such as orthogonal directions, for example. The filter 2 is provided at its input E with an impedance-matching transformer $T_1$, the secondary winding of which has a center tap connected to ground and is provided at its output S with an impedance-matching transformer $T_2$. Capacitors $C_1$ and $C_2$ respectively are connected to the terminals of the secondary winding of the transformer $T_1$ and to the primary winding of the transformer $T_2$. Said capacitors form respectively the secondary winding and the corresponding primary winding of the circuits which are tuned to the common frequency of the quartz crystals $Q_1$ and $Q_2$ in order to increase the selectivity of the filter. One end of each quartz crystal $Q_1$ and $Q_2$ is connected to one end of the secondary winding of the transformer $T_1$ whilst the quartz crystals $Q_1$ and $Q_2$ are connected at the level of their other terminal which is connected to one end of the secondary winding of the transformer $T_2$ whilst the other end of the transformer $T_2$ is connected to ground.

In FIG. 2c, the filter 2 comprises three quartz crystals $Q_1$, $Q_2$ and $Q_3$ which are connected in parallel and each have the same nominal frequency as the oscillator 1. The filter comprises series-connected impedance-matching capacitors designated respectively by the reference $C_7$ on the side nearest the input E and by the referenc $C_{10}$ on the side nearest the output S. Frequency-matching networks are provided at the input and at the output in order to achieve enhanced selectivity of the filter. These networks consist on the side nearest the input E of a capacitor $C_8$ which is connected in parallel and one end of which is grounded, and an inductance coil $L_8$ whose midpoint is connected to ground. Said networks consist on the side nearest the output, of a capacitor $C_9$ and an inductance coil $L_9$ which are connected in parallel and one terminal of which is connected to ground. The quartz crystal $Q_1$ is connected at one end at the common terminal or node to capacitors $C_7$ and $C_8$ and to the inductance coil $L_8$. The quartz crystals $Q_2$ and $Q_3$ have a first node terminal connected to the other end of the inductance coil $L_8$ and the second terminals of the quartz crystals $Q_1$, $Q_2$ and $Q_3$ are connected to each other and to the ungrounded terminal of the capacitor $C_9$ and of the inductance coil $L_9$ In FIG. 2d, the filter 2 comprises three quartz crystals $Q_1$, $Q_2$ and $Q_3$ connected in series. The filter comprises respectively an impedance-matching input transformer $T_1$ and an impedance-matching output transformer $T_2$. A capacitor $C_{11}$ is connected to the terminals of the secondary winding of the transformer $T_1$ and forms with this latter a circuit for tuning to the common frequency of the quartz crystals $Q_1$, $Q_2$ and $Q_3$ with a view to achieving enhanced selectivity of the filter. The same applies to the capacitor $C_{14}$ which is connected to the terminals of the primary winding of the output transformer $T_2$. Impedance matching is carried out by means of capacitors $C_{12}$ and $C_{13}$ which are connected at the common terminal or node respectively to the quartz crystals $Q_1$ and $Q_2$, and to the quartz crystals $Q_2$ and $Q_3$.

In accordance with the invention, each of the three quartz crystals of the filters described with reference to FIGS. 2c and 2d is oriented in a different direction of sensitivity to acceleration, for example along the three axes of a trihedron. This permits compensation for accelerations in all directions in space.

As shown in FIG. 3, the acceleration sensor is an oscillator 3 having the same frequency as the oscillator 1 to be compensated. The crystal of the oscillator 3 is an AT-cut quartz crystal in order to obtain good sensitivity to accelerations or, better still, is formed of lithium tantalate. Each output of the oscillators 1 and 3 is fed to one input of a mixer $M_3$. Said oscillators are connected in such a manner as to ensure that, when no acceleration occurs, the phase shift between the two inputs of the mixer $M_3$ is equal to $(2k+1)(\pi/2)$, where k is a whole number or zero. This phase shift is obtained, for example, by means of a line of length $L_1$ interposed between the output of the oscillator 1 and the corresponding input of the mixer $M_3$. The output of the mixer $M_3$ drives one input of an operational amplifier $A_1$, the other input of which receives a reference signal $V_0$ having a value equal to that of the signal $S_3$ when no acceleration occurs. The output of the amplifier $A_1$ is fed to the oscillator to be compensated in order to produce action on the phase of the negative-feedback loop of this latter. Compensation of the oscillator therefore takes place from the mixer $M_3$ as in the case of FIG. 1.

This circuit design can be improved by means of a special arrangement. In fact, the oscillator to be compensated is usually a high-performance temperature-controlled oscillator. Should it be desired to obtain optimum compensation of acceleration, it must accordingly be ensured that the sensing oscillator is also as stable as the oscillator 1 to be compensated. For this reason, it is an advantage to introduce a mixer $M_2$, the output of the two oscillators 1 and 3 being fed to said mixer but having a phase shift of $h\pi$, where h is a whole number or zero. The mixer then delivers at its output $S_2$ a signal representing the frequency difference between the two oscillators 1 and 3. The signal $S_2$ is applied to the input of a amplifier and low-pass filter 4, the output of which drives the frequency-control input of the acceleration-sensing oscillator in order to control the frequency of the oscillator 3 in dependence on the frequency of the oscillator 1. The presence of a low-pass filter in the amplifier 4 is intended to limit the frequency compensation of the oscillator 3 to very slow thermal drift. In fact, as stated in the foregoing, the phase modulation introduced by accelerations is equivalent to a frequency variation of the oscillator 3 and it is therefore necessary to separate these two parameters by means of the low-pass filter amplifier 4.

What is claimed is:

1. A device for providing compensation for the acceleration sensitivity of an osicllator outputting a first signal of nominal frequency, wherein said device comprises:

a sensing element receiving said output of said oscillator and providing a second signal of nominal frequency wherein said second signal has a frequency equal to said first signal and wherein the acceleration sensitivity of said sensing element is at least twice the acceleration sensitivity of said oscillator to be compensated;

a comparator for comparing the phase difference between the frequency of said first signal and the frequency of said second signal in order to output a phase modulation induced by acceleration; and a follow-up control device for receiving the output signal of said phase comparator and for producing and oscillator correction signal which is fed to said oscillator to be compensated whereby said sensing element, said comparator and said follow-up control device provide a negative-feedback loop of said oscillator to be compensated and whereby said correction signal modifies the phase of said negative-feedback loop.

2. A device according to claim 1, wherein said comparator is a mixer which receives the output signal of the sensing element and the output signal of the oscillator to be compensated which are phase-shifted by $(2k+1)(\pi 2)$ when no acceleration occurs, where k, is a whole number or zero.

3. A device according to claim 2, wherein said phase-shift by $(2k+1)(\pi/2)$ of line placed between the output of the oscillator to be compensensated by the corresponding input of the mixer.

4. A device according to claim 3, wherein said sensing element is a filter whose input is fed by the output of said oscillator to be compensated.

5. A device according to claim 4, wherein the filter comprises at least one resonator which is oriented in a given direction of preferential sensitivity to acceleration.

6. A device according to claim 3, wherein said sensing element is a second oscillator.

7. A device according to claim 6, wherein said device comprises a device for correcting the frequency drift of the second oscillator with respect to the oscillator to be compensated.

8. A device according to claim 7, wherein said drift-correcting device comprises a second mixer which receives the outputs of each of said oscillator to be compensated and said second oscillator wherein the outputs of said oscillator to be compensated and said second oscillator have a phase shift of h $\pi$, where h is a whole number or zero and said drift-correcting device further comprising an amplifier means for receiving the output of said second mixer, the amplified output of which constitutes a signal for correcting the drift of the second oscillator.

9. A device according to claim 8, wherein the outputs of each of said oscillators, said mixer output and said amplifier output form a negatigve-feedback loop of said second oscillator and wherein said drift-correcting signal is applied so as to modify the phase of said negative-feedback loop of the second oscillator.

10. A device according to claim 9, wherein the oscillator to be compensated is a quartz-crytal oscillator and wherein the sensing element is one of a filter and an oscillator and wherein said sensing element is one of lithium tantalate and AT-cut quartz.

* * * * *